United States Patent
Mori et al.

(10) Patent No.: US 9,580,576 B2
(45) Date of Patent: Feb. 28, 2017

(54) PIGMENT DISPERSION AND YELLOW RESIST COMPOSITION FOR COLOR FILTER AND INK COMPOSITION CONTAINING THE PIGMENT DISPERSION

(71) Applicant: CANON KABUSHIKI KAISHA, Tokyo (JP)

(72) Inventors: Shosei Mori, Hiratsuka (JP); Takeshi Sekiguchi, Tokyo (JP); Taichi Shintou, Saitama (JP); Yuko Katsumoto, Yokohama (JP); Takayuki Ujifusa, Ashigarakami-gun (JP); Takeshi Miyazaki, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 272 days.

(21) Appl. No.: 14/375,984

(22) PCT Filed: Feb. 27, 2013

(86) PCT No.: PCT/JP2013/056061
§ 371 (c)(1),
(2) Date: Jul. 31, 2014

(87) PCT Pub. No.: WO2013/129697
PCT Pub. Date: Sep. 6, 2013

(65) Prior Publication Data
US 2015/0010865 A1    Jan. 8, 2015

(30) Foreign Application Priority Data
Feb. 29, 2012 (JP) .................. 2012-043301

(51) Int. Cl.
| | | |
|---|---|---|
| *C09D 11/037* | (2014.01) | |
| *C09D 11/322* | (2014.01) | |
| *C09B 29/40* | (2006.01) | |
| *C09B 67/22* | (2006.01) | |
| *G02B 5/22* | (2006.01) | |
| *G03F 7/004* | (2006.01) | |
| *G03F 7/105* | (2006.01) | |
| *C08K 5/3432* | (2006.01) | |
| *G03F 7/00* | (2006.01) | |
| *G03F 7/027* | (2006.01) | |
| *C08K 5/3477* | (2006.01) | |
| *C09B 29/01* | (2006.01) | |
| *C09B 29/42* | (2006.01) | |
| *C09B 67/08* | (2006.01) | |

(52) U.S. Cl.
CPC .......... *C08K 5/3432* (2013.01); *C08K 5/3477* (2013.01); *C09B 29/0007* (2013.01); *C09B 29/3626* (2013.01); *C09B 67/0013* (2013.01); *C09B 67/0041* (2013.01); *C09D 11/037* (2013.01); *C09D 11/322* (2013.01); *G02B 5/223* (2013.01); *G03F 7/004* (2013.01); *G03F 7/0007* (2013.01); *G03F 7/027* (2013.01); *G03F 7/105* (2013.01)

(58) Field of Classification Search
CPC . C09D 11/037; C09D 11/322; C09B 29/3626; C09B 67/0041; G02B 5/223; G03F 7/0007; G03F 7/004; G03F 7/105
USPC ...................................... 106/31.77
See application file for complete search history.

(56) References Cited

U.S. PATENT DOCUMENTS

| | | | |
|---|---|---|---|
| 4,140,684 A * | 2/1979 | Burkhard | C09B 29/3626 534/582 |
| 4,514,226 A | 4/1985 | Leoffler | |
| 6,187,495 B1 | 2/2001 | Chiba et al. | |
| 6,918,955 B2 | 7/2005 | Yokoyama | |
| 7,193,068 B2 * | 3/2007 | Araki | C07D 213/85 347/106 |
| 7,504,488 B2 * | 3/2009 | Toyoda | C09D 11/328 106/31.48 |
| 7,833,685 B2 | 11/2010 | Tanaka et al. | |
| 7,931,743 B2 * | 4/2011 | Saito | C09D 11/322 106/31.6 |

(Continued)

FOREIGN PATENT DOCUMENTS

| | | |
|---|---|---|
| CN | 101092525 A | 12/2007 |
| DE | 699 32 388 T2 | 7/2007 |

(Continued)

OTHER PUBLICATIONS

English translation of JP 2011/257706; Dec. 2011; 38 pages.*

(Continued)

*Primary Examiner* — Helene Klemanski
(74) *Attorney, Agent, or Firm* — Fitzpatrick, Cella, Harper & Scinto

(57) ABSTRACT

Provided is a pigment dispersion excellent in the dispersibility of C.I. Pigment yellow 185. The pigment dispersion includes C.I. Pigment yellow 185 and a compound represented by the following formula (1), which are dispersed in a dispersing medium:

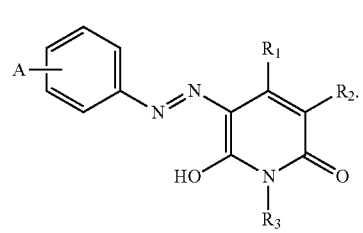

formula (1)

4 Claims, 2 Drawing Sheets

(56) References Cited

U.S. PATENT DOCUMENTS

| | | | |
|---|---|---|---|
| 8,211,221 B2* | 7/2012 | Tanaka | C09D 11/328 106/31.46 |
| 8,211,606 B2 | 7/2012 | Murai et al. | |
| 9,012,115 B2* | 4/2015 | Ujifusa | G03G 9/0906 430/108.1 |
| 9,170,513 B2* | 10/2015 | Mori | G03G 9/091 |
| 9,323,168 B2 | 4/2016 | Mori et al. | |
| 2009/0075193 A1* | 3/2009 | Murai | C09D 11/037 430/108.23 |
| 2010/0035171 A1 | 2/2010 | Watanabe et al. | |
| 2010/0039028 A1 | 2/2010 | Suzuki et al. | |
| 2014/0170553 A1 | 6/2014 | Mori et al. | |
| 2014/0349036 A1* | 11/2014 | Katsumoto | C09D 11/322 428/32.6 |
| 2014/0370207 A1* | 12/2014 | Sekiguchi | C09D 11/322 428/32.6 |
| 2015/0037725 A1 | 2/2015 | Mori et al. | |
| 2015/0140487 A1* | 5/2015 | Sekiguchi | G03G 9/0806 430/108.23 |
| 2015/0378273 A1* | 12/2015 | Mori | G03G 9/08 430/108.23 |

FOREIGN PATENT DOCUMENTS

| | | |
|---|---|---|
| JP | 57-167353 A | 10/1982 |
| JP | 2000-162824 A | 6/2000 |
| JP | 2004-027204 A | 1/2004 |
| JP | 2006-313302 A | 11/2006 |
| JP | 2007-071924 A | 3/2007 |
| JP | 2007-112919 A | 5/2007 |
| JP | 2010-044981 A | 2/2010 |
| JP | 2011-123209 A | 6/2011 |
| JP | 2011-257706 A | 12/2011 |
| JP | 2011-257707 A | 12/2011 |
| KR | 10-2010-0021362 A | 2/2010 |
| WO | 2008/114886 A1 | 9/2008 |
| WO | 2013/133449 A1 | 9/2013 |

OTHER PUBLICATIONS

Examination Report in German Patent Application No. 11 2013 001 217.0 (Feb. 11, 2016).
Notice of Preliminary Rejection in Korean Application No. 10-2014-7026207 (mailed May 4, 2016).
First Office Action in Chinese Application No. 201380011537.1 (issued May 28, 2015).
Mori et al., U.S. Appl. No. 14/376,227, filed Aug. 1, 2014.
Notification of Reasons for Refusal in Japanese Application No. 2013-038162 (Jul. 19, 2016).

* cited by examiner

PIGMENT DISPERSION AND YELLOW RESIST COMPOSITION FOR COLOR FILTER AND INK COMPOSITION CONTAINING THE PIGMENT DISPERSION

TECHNICAL FIELD

The present invention relates to a pigment dispersion for use in production steps of coating materials, inks, color filters, resin moldings, etc. The present invention further relates to a yellow resist composition for color filter and an ink composition containing the pigment dispersion as a colorant.

BACKGROUND ART

With the explosive proliferation of color images, there has been growing demand for higher image quality in recent years. In full-color digital copiers or printers, color image data is color-separated through respective color filters of blue, green, and red, and a latent image corresponding to the original image is then developed using respective color developers of yellow, magenta, cyan, and black. In this regard, the coloring power of a colorant in each color developer largely influences image quality. For the dispersion of pigments in various media, however, it is generally difficult to render pigment particles sufficiently fine or to disperse the pigments uniformly.

Typical examples of the yellow colorant include pigments having an isoindoline skeleton, such as C.I. Pigment yellow 185, which has high transparency and coloring power and excellent weather resistance.

This C.I. Pigment yellow 185 tends to self-aggregate due to its pigment character and is known to be dispersed neither sufficiently nor stably as a colorant in a binder resin. Unfortunately, this pigment, albeit excellent in weather resistance, cannot sufficiently exert its original performance in transparency or color saturation. In order to solve such a problem, for example, PTL 1 discloses a pigment dispersant such as a pigment dispersion containing an isoindoline pigment with an introduced sulfonic acid group.

Also, PTL 2 discloses a color filter having a contrast ratio or Y value improved by using Solvent yellow 162 as a phthalocyanine pigment.

The reproducibility of color spaces including Japan Color for printing industry and Adobe RGB for desktop publishing (DTP) has become increasingly important in recent years. For this reproducibility of color spaces, only improvement in the dispersibility of pigments is not sufficient, and it is necessary to use dyes having a wide color gamut. The dyes, however, are known to have weaker light resistance than that of pigments. No dye has been found to be able to resist, at the same level as in pigments, deterioration with age.

CITATION LIST

Patent Literature

PTL 1: Japanese Patent Application Laid-Open No. 2007-112919

PTL 2: Japanese Patent Application Laid-Open No. 2011-123209

SUMMARY OF INVENTION

Technical Problem

An object of the present invention is to solve the problems described above.

Specifically, an object of the present invention is to provide a pigment dispersion excellent in the dispersibility of C.I. Pigment yellow 185 in a dispersing medium. Another object of the present invention is to provide a yellow resist composition for color filter and an ink composition containing the pigment dispersion.

Solution to Problem

The objects are attained by an invention shown below.

Specifically, the present invention relates to a pigment dispersion containing a dispersing medium, C.I. Pigment yellow 185, and a compound represented by the following formula (1), the C.I. Pigment yellow 185 and the compound being dispersed in the dispersing medium. The present invention also relates to a yellow resist composition for color filter and an ink composition having favorable yellow tone.

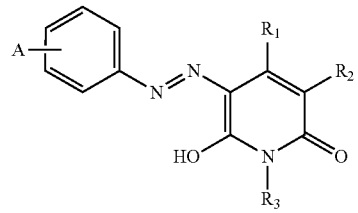

Formula (1)

wherein A represents $-SO_2N(R_4)R_5$ or $-CON(R_4)R_5$ wherein $R_4$ represents a hydrogen atom or an alkyl group, and $R_5$ represents an alkyl group; $R_1$ represents an alkyl group, an aryl group, or an amino group; $R_3$ represents a hydrogen atom, an alkyl group, an aryl group, or an aralkyl group; and $R_2$ represents (i) a hydrogen atom, a cyano group, or a carbamoyl group provided that $R_3$ represents a hydrogen atom, or (ii) a hydrogen atom, a cyano group, a carboxylic acid group, a carboxylic acid ester group, a carboxylic acid amide group, or a carbamoyl group provided that $R_3$ represents an alkyl group, an aryl group, or an aralkyl group.

Advantageous Effects of Invention

The present invention can provide a pigment dispersion excellent in the dispersibility of C.I. Pigment yellow 185 in a dispersing medium. Furthermore, use of the pigment dispersion can provide a resist composition for color filter and an ink composition having favorable yellow tone.

Further features of the present invention will become apparent from the following description of exemplary embodiments with reference to the attached drawings.

DESCRIPTION OF EMBODIMENTS

Figure 1:
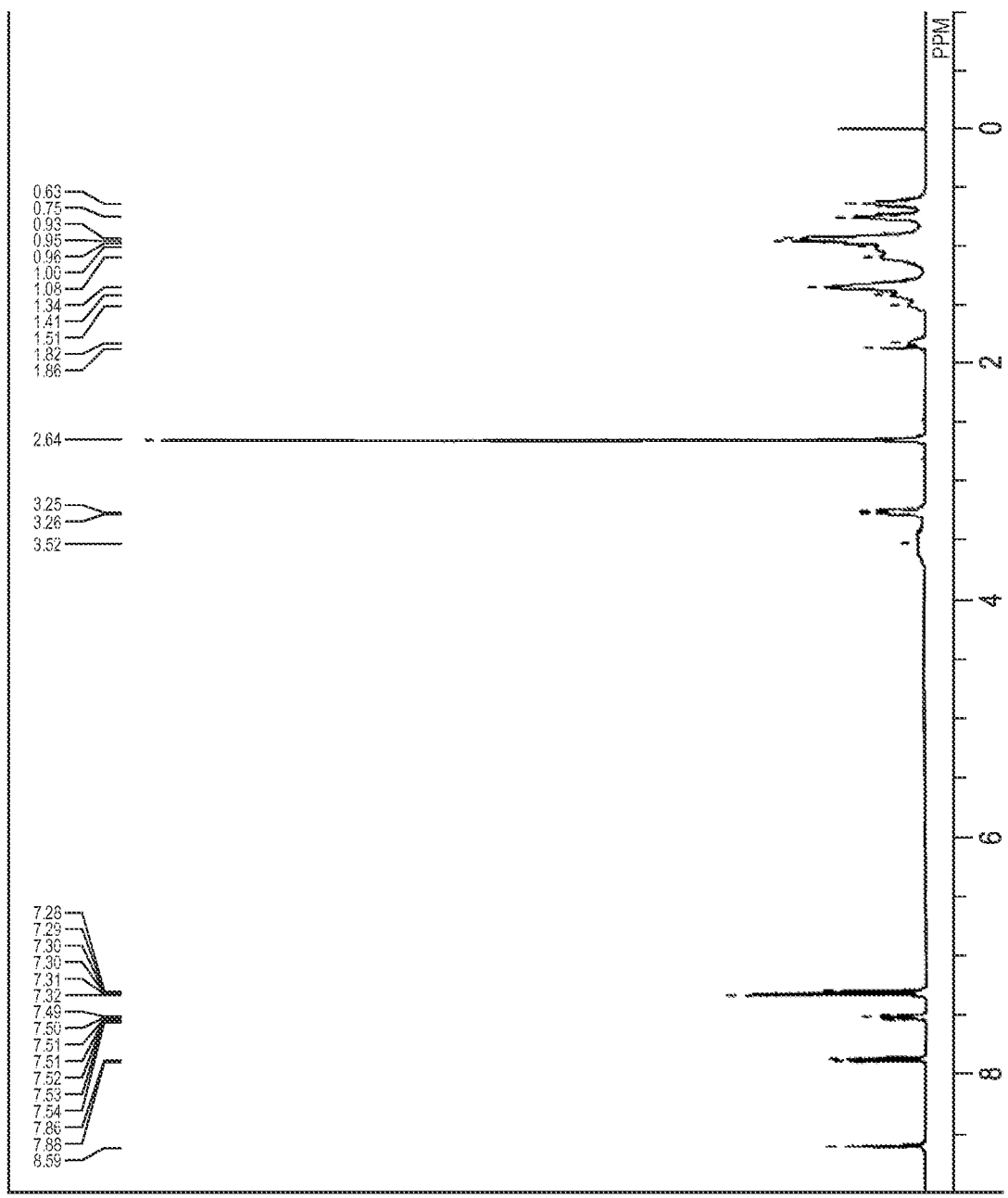
FIG. 1 is a diagram illustrating $^1$H NMR spectra of a compound (5) represented by the formula (1) of the present invention at 400 MHz at room temperature in DMSO-$d_6$.

Hereinafter, the present invention will be described in more detail with reference to embodiments.

The present inventors have conducted diligent studies to solve the problems of the conventional techniques and consequently found that C.I. Pigment yellow 185 and the compound represented by the formula (1) can be contained in a dispersing medium to thereby yield a pigment dispersion excellent in the dispersibility of the C.I. Pigment yellow 185. The present inventors have also found that use of the pigment dispersion can yield a yellow resist composition for color filter and an ink composition that permit image display with high spectral characteristics and display contrast because of their favorable yellow tone. Based on these findings, the present invention has been completed.

The C.I. Pigment yellow 185 tends to self-aggregate due to its pigment character and is known to be insufficiently dispersed as a colorant in a binder resin. This is partly due to its known structural influence. The present inventors have found that the compound represented by the formula (1) suppresses the self-aggregation of C.I. Pigment yellow 185.

The reason why the compound represented by the formula (I) suppresses the self-aggregation of C.I. Pigment yellow 185 is presumably the intermolecular interaction between the C.I. Pigment yellow 185 and the compound of the formula (1).

Meanwhile, pigments, such as C.I. Pigment yellow 185, exist in the form of an aggregate having a certain size. Even though only the surface of this aggregate is degraded by the influence of light, the inside of each pigment is insusceptible to light. As a result, the degraded surface portion is likely to function as a protective membrane, enhancing the light resistance of the pigment. By contrast, dyes are dissolved or uniformly dispersed in a medium. These dyes seem to be influenced directly by light due to a lack of a protective membrane-like function and thereby easily degraded.

In the present invention, the presence of the compound of the formula (1) can suppress the self-aggregation of the C.I. Pigment yellow 185 and improve its dispersibility. In other words, the compound of the formula (1) is incorporated into the fine dispersion of this pigment and thereby protected by the C.I. Pigment yellow 185, which, probably, in turn suppresses the influence of light on the compound of the formula (1).

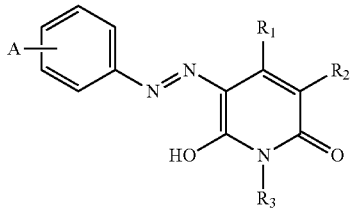

Formula (1)

wherein A represents —SO$_2$N(R$_4$)R$_5$ or —CON(R$_4$)R$_5$ wherein R$_4$ represents a hydrogen atom or an alkyl group, and R$_5$ represents an alkyl group; R$_1$ represents an alkyl group, an aryl group, or an amino group; R$_3$ represents a hydrogen atom, an alkyl group, an aryl group, or an aralkyl group; and R$_2$ represents (i) a hydrogen atom, a cyano group, or a carbamoyl group provided that R$_3$ represents a hydrogen atom, or (ii) a hydrogen atom, a cyano group, a carboxylic acid group, a carboxylic acid ester group, a carboxylic acid amide group, or a carbamoyl group provided that R$_3$ represents an alkyl group, an aryl group, or an aralkyl group.

Examples of the alkyl group represented by R$_1$ in the formula (1) include, but not particularly limited to, linear or branched alkyl groups having 1 to 20 carbon atoms. Among them, linear or branched alkyl groups having 4 to 12 carbon atoms are preferable in terms of further improvement in the dispersibility of the C.I. Pigment yellow 185 in the dispersing medium. Linear or branched alkyl groups having 6 to 10 carbon atoms are more preferable.

Examples of the aryl group represented by R$_1$ in the formula (1) include, but not particularly limited to, 6- to 14-membered monocyclic or polycyclic aryl groups such as phenyl and naphthyl groups. Among them, a phenyl group is preferable.

Examples of the carboxylic acid ester group represented by R$_2$ in the formula (1) include, but not particularly limited to, carboxylic acid methyl ester, carboxylic acid ethyl ester, carboxylic acid propyl ester, and carboxylic acid butyl ester groups.

Examples of the carboxylic acid amide group represented by R$_2$ in the formula (1) include, but not particularly limited to: mono-substituted amide groups such as carbamoyl, carboxylic acid methyl amide, carboxylic acid butyl amide, a carboxylic acid hexyl amide, and carboxylic acid phenyl amide groups; and di-substituted amide groups such as carboxylic acid dimethyl amide, carboxylic acid diphenyl amide, and carboxylic acid methylpropyl amide groups.

In the formula (1), R$_3$ represents a hydrogen atom, an alkyl group, an aryl group, or an aralkyl group. Among them, R$_3$ is preferably a hydrogen atom or an alkyl group.

In the formula (1), R$_2$ represents (i) a hydrogen atom, a cyano group, or a carbamoyl group provided that R$_3$ is a hydrogen atom, or (ii) a hydrogen atom, a cyano group, a carboxylic acid group, a carboxylic acid ester group, carboxylic acid amide group, or a carbamoyl group provided that R$_3$ is an alkyl group, an aryl group, or an aralkyl group.

Examples of the alkyl group represented by R$_3$ in the formula (1) include, but not particularly limited to, linear or branched alkyl groups having 1 to 20 carbon atoms. Among them, linear or branched alkyl groups having 4 to 12 carbon atoms are preferable in terms of further improvement in the dispersibility of the C.I. Pigment yellow 185 in the dispersing medium. Linear or branched alkyl groups having 6 to 10 carbon atoms are more preferable.

Examples of the aryl group represented by R$_3$ in the formula (1) include, but not particularly limited to, 6- to 14-membered monocyclic or polycyclic aryl groups such as phenyl and naphthyl groups. Among them, a phenyl group is preferable.

Examples of the aralkyl group represented by R$_3$ in the formula (1) include, but not particularly limited to, benzyl and phenethyl groups.

In the formula (1), A represents —SO$_2$N(R$_4$)R$_5$ or —CON (R$_4$)R$_5$ wherein R$_4$ represents a hydrogen atom or an alkyl group, and R$_5$ represents an alkyl group. Among them, A is preferably —CON(R$_4$)R$_5$. More preferably, R$_4$ and R$_5$ are structurally identical.

Examples of the alkyl group represented by R$_4$ or R$_5$ in the formula (1) include, but not particularly limited to, linear or branched alkyl groups having 1 to 20 carbon atoms. Among them, linear or branched alkyl groups having 4 to 12 carbon atoms are preferable in terms of further improvement in the dispersibility of the C.I. Pigment yellow 185 in the dispersing medium. Linear or branched alkyl groups having 6 to 10 carbon atoms are more preferable, with a branched ethylhexyl group being further preferable.

The compound represented by the formula (1) according to the present invention can be synthesized with reference to, for example, a known method described in International Application No. WO08/114886.

Specific examples of the compound represented by the formula (1) of the present invention preferably include, but not limited to, compounds (1) to (26) shown below. In each structural formula, Et represents an ethyl group, and n-Bu represents a n-butyl group.

Although the formula (1) represents an azo form, the compound represented by the formula (1) is an azo-hydrazo tautomer. The hydrazo form is also included in the scope of the present invention.

Compound (1)

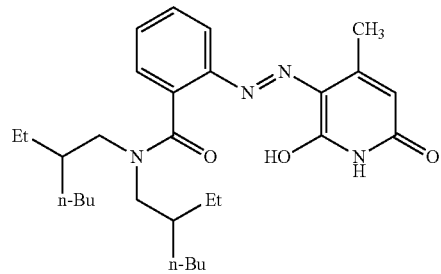

Compound (2)

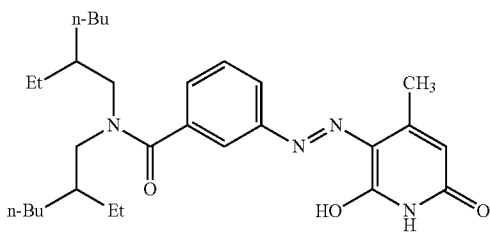

Compound (3)

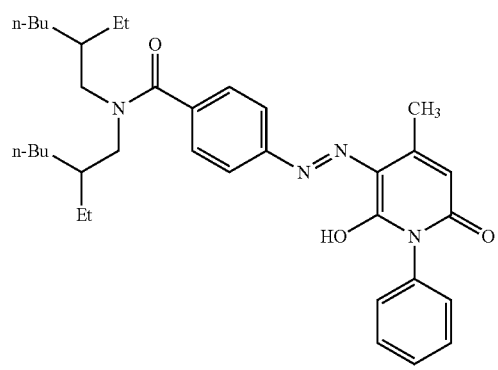

Compound (4)

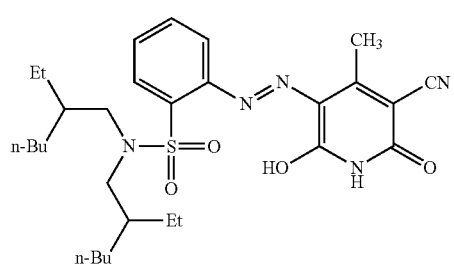

Compound (5)

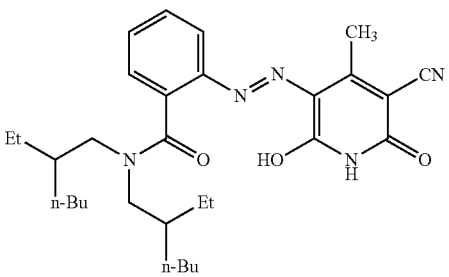

Compound (6)

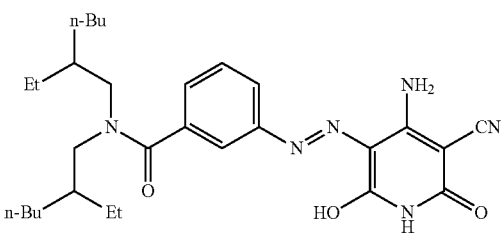

Compound (7)

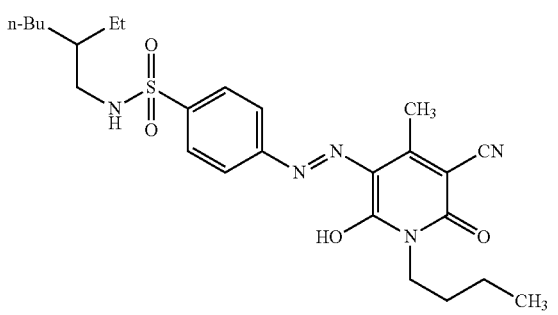

Compound (8)

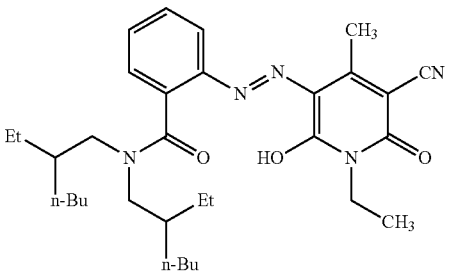

Compound (9)

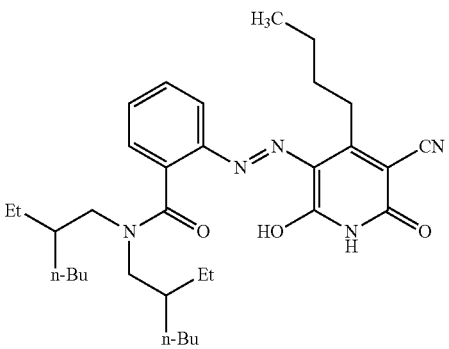

-continued
Compound (10)
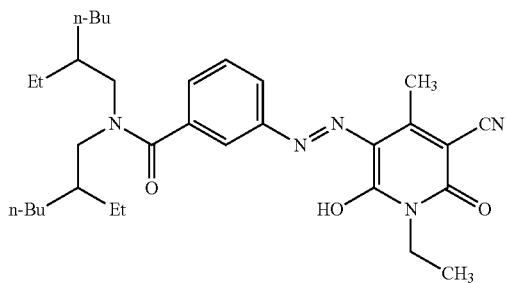
Compound (11)
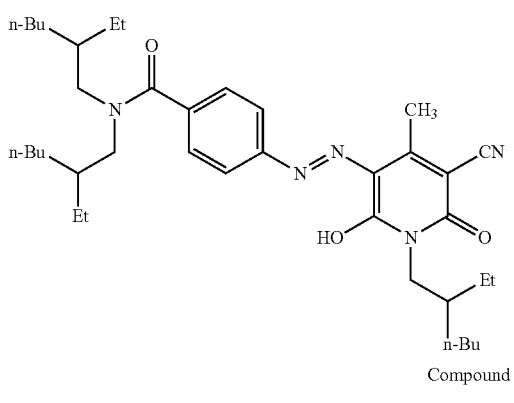
Compound (12)
Compound (13)
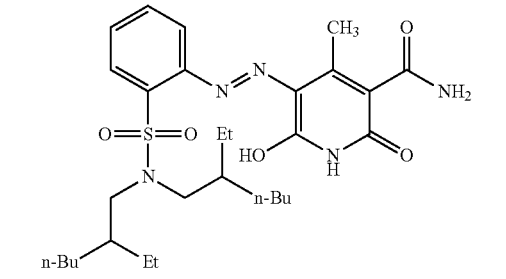
Compound (14)
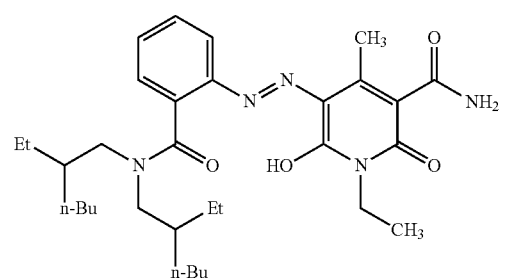
Compound (15)
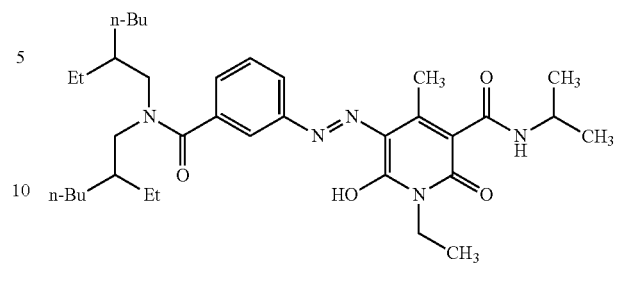
Compound (16)
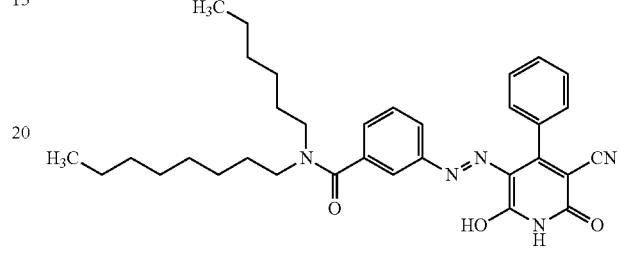
Compound (17)
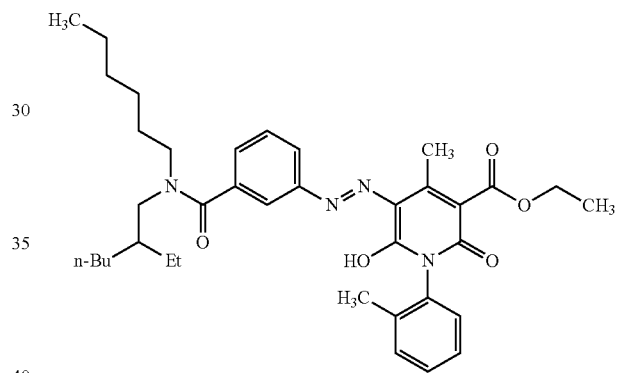
Compound (18)
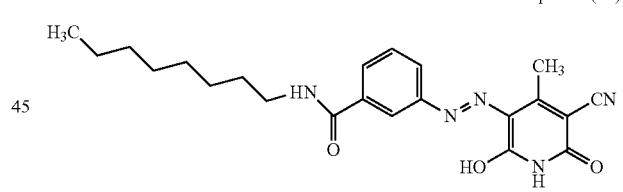
Compound (19)
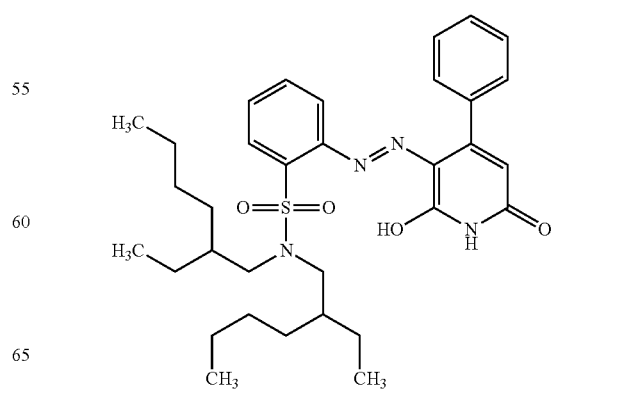

-continued

Compound (20)
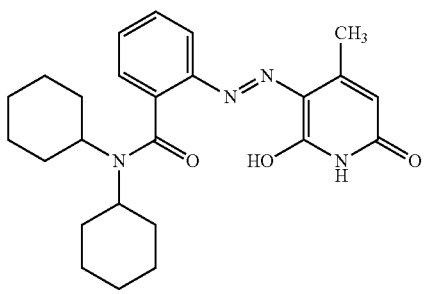

Compound (21)
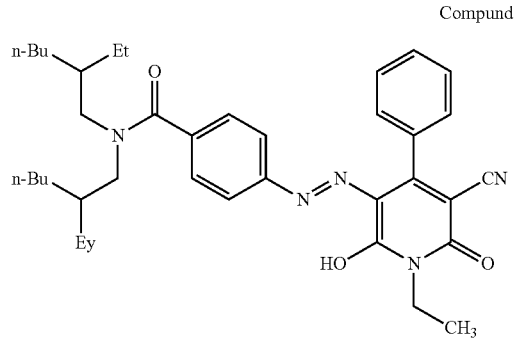

Compound (22)
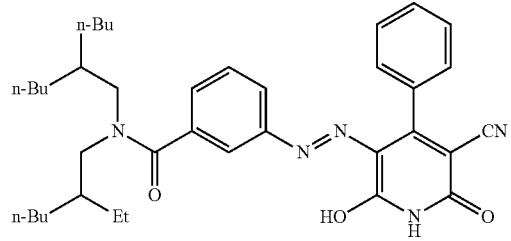

Compound (23)
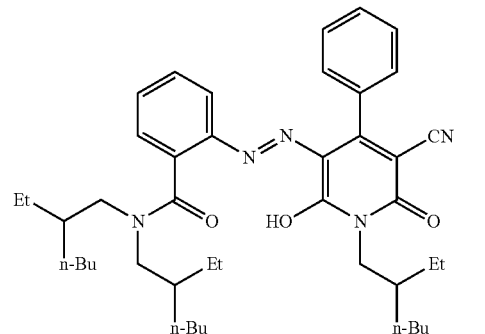

Compound (24)
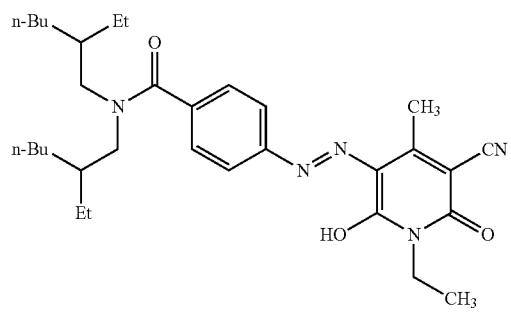

Compound (25)
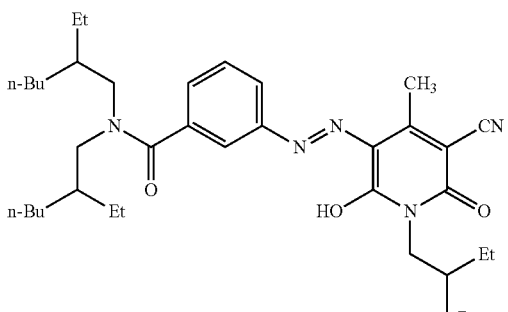

Compound (26)
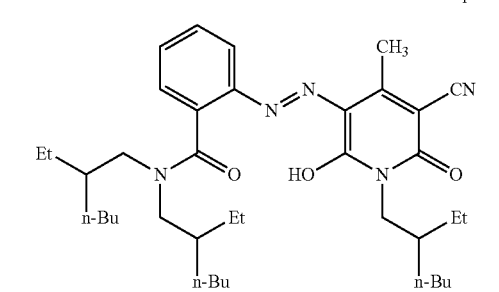

The compound represented by the formula (1) for use in the present invention is excellent in coloring power. According to the intended application in which the pigment dispersion of the present invention is used, these compounds may be used alone, or two or more known yellow dyes may be used in combination, in order to adjust tone, etc.

<Regarding Pigment Dispersion>

The pigment dispersion of the present invention is obtained by dispersing at least C.I. Pigment yellow 185 and the compound represented by the formula (1) in a dispersing medium. The dispersing medium described in the present invention refers to water, an organic solvent, or a mixture thereof.

The pigment dispersion of C.I. Pigment yellow 185 of the present invention can be prepared by a known dispersion method. For example, the pigment dispersion of the present invention can be obtained as follows: C.I. Pigment yellow 185 and the compound of the formula (1) are added into a dispersing medium, and, if necessary, a resin is dissolved into the mixture, followed by stirring. A mechanical shear force can be further applied thereto using a dispersing machine to prepare a stable and uniform fine dispersion containing fine pigment particles.

Alternatively, a resin is dissolved into a dispersing medium, and C.I. Pigment yellow 185 is then suspended therein. The compound represented by the formula (1) is gradually added to the suspension with stirring and thereby sufficiently blended with the dispersing medium. A mechanical shear force may be further applied thereto using a dispersing machine to prepare a stable and uniform fine dispersion containing fine pigment particles.

The dispersing machine for use in the present invention is not particularly limited. For example, a medium-type dispersing machine (e.g., a rotary shear homogenizer, a ball mill, a sand mill, or an attritor) or a high-pressure counter-impact-type dispersing machine is preferably used.

The pigment dispersion of the present invention contains 1.0 to 30.0 parts by mass, preferably 2.0 to 20.0 parts by mass, more preferably 3.0 to 15.0 parts by mass, of the C.I.

Pigment yellow 185 with respect to 100 parts by mass of the dispersing medium. When the content of the C.I. Pigment yellow 185 falls within this range, favorable coloring power can be obtained.

The compound represented by the formula (1) can be used at preferably 10 to 100 parts by mass, more preferably 10 to 50 parts by mass, with respect to 100 parts by mass of the C.I. Pigment yellow 185. When the content of the compound falls within this range, favorable dispersibility and coloring power can be obtained while the light degradation of the compound represented by the formula (1) can be suppressed.

In order to obtain the favorable dispersion stability of the pigment dispersion of the present invention, the components can be dispersed in water using an emulsifier. Examples of the emulsifier include, but not particularly limited to, cationic surfactants, anionic surfactants, and nonionic surfactants.

Examples of the cationic surfactants that may be used as the emulsifier for use in the present invention include, but not particularly limited to, dodecyl ammonium chloride, dodecyl ammonium bromide, dodecyltrimethyl ammonium bromide, dodecyl pyridinium chloride, dodecyl pyridinium bromide, and hexadecyltrimethyl ammonium bromide.

Examples of the anionic surfactants include: fatty acid soap such as sodium stearate and sodium dodecanoate; and sodium dodecyl sulfate, sodium dodecylbenzenesulfonate, and sodium lauryl sulfate.

Examples of the nonionic surfactants include, but not particularly limited to, polyoxyethylene dodecyl ether, polyoxyethylene hexadecyl ether, polyoxyethylene nonylphenyl ether, polyoxyethylene lauryl ether, sorbitan monooleate polyoxyethylene ether, and monodecanoyl sucrose.

The organic solvent that may be used as the dispersing medium in the pigment dispersion of the present invention is determined according to the intended application of the pigment and is not particularly limited. Specific examples thereof include: alcohols such as methyl alcohol, ethyl alcohol, denatured ethyl alcohol, isopropyl alcohol, n-butyl alcohol, isobutyl alcohol, tert-butyl alcohol, sec-butyl alcohol, tert-amyl alcohol, 3-pentanol, octyl alcohol, benzyl alcohol, and cyclohexanol; glycols such as methyl cellosolve, ethyl cellosolve, diethylene glycol, and diethylene glycol monobutyl ether; ketones such as acetone, methyl ethyl ketone, and methyl isobutyl ketone; esters such as ethyl acetate, butyl acetate, ethyl propionate, and cellosolve acetate; hydrocarbon solvents such as hexane, octane, petroleum ether, cyclohexane, benzene, toluene, and xylene; halogenated hydrocarbon solvents such as carbon tetrachloride, trichloroethylene, and tetrabromoethane; ethers such as diethyl ether, dimethyl glycol, trioxane, and tetrahydrofuran; acetals such as methylal and diethylacetal; organic acids such as formic acid, acetic acid, and propionic acid; and sulfur- and nitrogen-containing organic compounds such as nitrobenzene, dimethylamine, monoethanolamine, pyridine, dimethyl sulfoxide, and dimethylformamide.

Alternatively, a polymerizable monomer may be used as the organic solvent for use in the present invention. The polymerizable monomer is an addition-polymerizable or condensation-polymerizable monomer, preferably an addition-polymerizable monomer. Specific examples thereof can include: styrene monomers such as styrene, o-methylstyrene, m-methylstyrene, p-methylstyrene, o-ethylstyrene, m-ethylstyrene, and p-ethylstyrene; acrylate monomers such as methyl acrylate, ethyl acrylate, propyl acrylate, butyl acrylate, octyl acrylate, dodecyl acrylate, stearyl acrylate, behenyl acrylate, 2-ethylhexyl acrylate, dimethylaminoethyl acrylate, diethylaminoethyl acrylate, acrylonitrile, and acrylamide; methacrylate monomers such as methyl methacrylate, ethyl methacrylate, propyl methacrylate, butyl methacrylate, octyl methacrylate, dodecyl methacrylate, stearyl methacrylate, behenyl methacrylate, 2-ethylhexyl methacrylate, dimethylaminoethyl methacrylate, diethylaminoethyl methacrylate, methacrylonitrile, and methacrylamide; olefin monomers such as ethylene, propylene, butylene, butadiene, isoprene, isobutylene, and cyclohexene; vinyl halides such as vinyl chloride, vinylidene chloride, vinyl bromide, and vinyl iodide; vinyl esters such as vinyl acetate, vinyl propionate, and vinyl benzoate; vinyl ethers such as vinyl methyl ether, vinyl ethyl ether, and vinyl isobutyl ether; and vinyl ketone compounds such as vinyl methyl ketone, vinyl hexyl ketone, and methyl isopropenyl ketone. These polymerizable monomers can be used alone or in combination of two or more thereof according to the application in which the pigment dispersion of the present invention is used. In the case of using the pigment dispersion of the present invention in polymerized toner application, styrene or a styrene monomer, among the polymerizable monomers, is preferably used alone or as a mixture with an additional polymerizable monomer. Particularly, styrene is preferable because of its manageability.

The pigment dispersion may be further supplemented with a resin. The resin that may be used in the pigment dispersion is determined according to the intended application thereof and is not particularly limited. Specific examples thereof include polystyrene resins, styrene copolymers, polyacrylic acid resins, polymethacrylic acid resins, polyacrylic acid ester resins, polymethacrylic acid ester resins, acrylic acid copolymers, methacrylic acid copolymers, polyester resins, polyvinyl ether resins, polyvinylmethyl ether resins, polyvinyl alcohol resins, and polyvinyl butyral resins. Other examples thereof include polyurethane resins and polypeptide resins. These resins can be used alone or as a mixture of two or more thereof.

<Regarding Ink>

The pigment dispersion of the present invention can be prepared into an ink composition available as an ink. The aqueous dispersing medium is particularly preferable for this purpose. Alternatively, a mixed solvent of water and a water-soluble organic solvent may be used. In this regard, the water-soluble organic solvent used is not limited as long as the organic solvent is soluble in water. Examples thereof include alcohols, polyhydric alcohols, polyethylene glycol, glycol ether, nitrogen-containing polar solvents, and sulfur-containing polar solvents.

In the production of the ink containing the pigment dispersion of the present invention, the pH of the ink is not particularly limited and is preferably within the range of 4.0 to 11.0 in consideration of safety. In the preparation of an ink for ink jet, a solid humectant such as urea, a urea derivative, or trimethylolpropane may also be used as a component in the ink in order to maintain ink retention. The content of the solid humectant such as urea, a urea derivative, or trimethylolpropane in the ink is generally preferably in the range of 0.1% by mass or more and 20.0% by mass or less, more preferably in the range of 3.0% by mass or more and 10.0% by mass or less, with respect to the mass of the ink.

The ink may further contain, in addition to the components described above, various optional additives such as a pH adjuster, a rust preventive, a preservative, a fungicide, an antioxidant, an anti-reduction agent, an evaporation promoter, a chelating agent, and a water-soluble polymer.

The ink containing the pigment dispersion of the present invention, as described above, is particularly preferably used in an ink jet recoding system which performs recording by ejecting droplets by the action of thermal energy. Of course, the ink containing the pigment dispersion of the present invention may be used as a material for inks applied to other ink jet recording methods, general writing utensils, etc.

<Regarding Yellow Resist Composition for Color Filter>

The pigment dispersion of the present invention has vibrant yellow tone and can be used as a color material for yellow, preferably, a colorant for color filter, because of its spectral characteristics.

The yellow resist composition of the present invention contain at least one or more pigment dispersions of the present invention. Further, the yellow resist composition may contain a binder resin, a photopolymerizable monomer, a photopolymerization initiator, or a solvent and so on.

Alternatively, in a color filter in which two or more pixels differing in spectral characteristics are adjacently arranged on a substrate, the pigment dispersion of the present invention can be used in at least one of these two or more pixels (e.g., red, green, and blue pixels) to thereby provide pixels with high transparency and high color purity.

The content of the C.I. Pigment yellow 185 in the pigment dispersion of the present invention is preferably 0.1 to 400% by mass, more preferably 1 to 200% by mass, with respect to the mass of the binder resin described below.

The binder resin that can be used in the yellow resist composition for color filter of the present invention is not particularly limited as long as its light-irradiated portion or light-shielded portion is soluble in an organic solvent, an aqueous alkali solution, water, or a commercially available developing solution. More desirably, the binder resin has water- or alkali-developable composition from the viewpoint of workability, waste disposal, etc.

Binder resins obtained by copolymerizing a hydrophilic monomer typified by, for example, acrylic acid, methacrylic acid, 2-hydroxyethyl, acrylamide, N-vinylpyrrolidone, or a monomer having ammonium salt with a lipophilic monomer typified by, for example, acrylic acid ester, methacrylic acid ester, vinyl acetate, styrene, or N-vinylcarbazole at an appropriate mixing ratio by a known approach are generally known as such resins. These binder resins can be used as a negative resist, i.e., of a type in which the light-shielded portion is removed by development, in combination with a radical-polymerizable monomer having an ethylenically unsaturated group, a cationically polymerizable monomer having an oxirane or oxetane ring, a radical-generating agent, or an acid- or base-generating agent.

Alternatively, a binder resin typified by, for example, carbonic acid tert-butyl ester, tert-butyl ester, tetrahydropyranyl ester, or tetrahydropyranyl ether of polyhydroxystyrene may be used. This type of binder resin can be used as a positive resist, i.e., of a type in which the light-irradiated portion is removed by development, in combination with an acid-generating agent.

The yellow resist composition for color filter of the present invention contains a photopolymerizable monomer having one or more ethylenically unsaturated double bond(s) as a monomer having ethylenically unsaturated double bond (s) that is addition-polymerizable by light irradiation. Examples of the photopolymerizable monomer include compounds each having at least one addition-polymerizable ethylenically unsaturated group in the molecule and having a boiling point of 100° C. or higher at ordinary pressure. Examples of such compounds can include: monofunctional acrylates and monofunctional metacrylates such as polyethylene glycol monoacrylate, polyethylene glycol monomethacrylate, polypropylene glycol monoacrylate, polypropylene glycol monomethacrylate, phenoxyethyl acrylate, phenoxyethyl methacrylate; polyfunctional acrylates and methacrylates such as polyethylene glycol diacrylate, polyethylene glycol dimethacrylate, polypropylene glycol diacrylate, polypropylene glycol dimethacrylate, trimethylolethane triacrylate, trimethylolethane trimethacrylate, trimethylolpropane triacrylate, trimethylolpropane trimethacrylate, trimethylolpropane diacrylate, trimethylolpropane dimethacrylate, neopentyl glycol diacrylate, neopentyl glycol dimethacrylate, pentaerythritol tetraacrylate, pentaerythritol tetramethacrylate, pentaerythritol triacrylate, pentaerythritol trimethacrylate, dipentaerythritol hexaacrylate, dipentaerythritol hexamethacrylate, dipentaerythritol pentaacrylate, dipentaerythritol pentamethacrylate, hexanediol diacrylate, hexanediol dimethacrylate, trimethylolpropane tri(acryloyloxypropyl)ether, tri(acryloyloxyethyl)isocyanurate, tri(acryloyloxyethyl)cyanurate, glycerin triacrylate, and glycerin trimethacrylate; and other polyfunctional acrylates and methacrylates such as acrylation or methacrylation products of ethylene oxide or propylene oxide adducts of polyfunctional alcohols (e.g., trimethylolpropane and glycerin).

Further examples thereof include polyfunctional acrylates and methacrylates such as urethane acrylates, polyester acrylates, and epoxy acrylates which are reaction products of epoxy resins and acrylic acid or methacrylic acid. Among them, trimethylolpropane triacrylate, trimethylolpropane trimethacrylate, pentaerythritol tetraacrylate, pentaerythritol tetramethacrylate, dipentaerythritol hexaacrylate, dipentaerythritol hexamethacrylate, dipentaerythritol pentaacrylate, or dipentaerythritol pentamethacrylate is preferable.

The photopolymerizable monomers having two or more ethylenically unsaturated double bonds may be used alone or as a mixture of two or more thereof. The content of the polymerizable compound is generally 5 to 50% by mass, particularly preferably 10 to 40% by mass, with respect to the mass (total solid content) of the colored photosensitive composition. The content less than 5% is not preferable because photosensitivity or pixel intensity may be reduced. The content exceeding 50% by mass is not preferable because a photosensitive resin layer may become excessively sticky.

The yellow resist composition for color filter of the present invention may be ultraviolet curable and, in this case, contains a photopolymerization initiator. Examples of the photopolymerization initiator include vicinal polyketaldonyl compounds, α-carbonyl compounds, acyloin ether, polynuclear quinone compounds, the combination of triallyl imidazole dimer and p-aminophenyl ketone, and trioxadiazole compounds. Preferable examples thereof include 2-benzyl-2-dimethylamino-1-(4-morpholinophenyl)butanone (Irgacure 369 (trade name), manufactured by Ciba Specialty Chemicals Inc.). The photopolymerization initiator is not essential when electron beam is used in pixel formation using the colored resist of the present invention.

The yellow resist composition for color filter of the present invention contains a solvent for dissolving or dispersing therein the binder resin, the photopolymerizable monomer, the photopolymerization initiator, and the colorant. Examples of the solvent that can be used include cyclohexanone, ethyl cellosolve acetate, butyl cellosolve acetate, 1-methoxy-2-propyl acetate, diethylene glycol dimethyl ether, ethylbenzene, 1,2,4-trichlorobenzene, ethylene glycol diethyl ether, xylene, ethyl cellosolve, methyl-n-amyl ketone, propylene glycol monomethyl ether, toluene, methyl ethyl ketone, ethyl acetate, methanol, ethanol, isopropyl alcohol, butanol, isobutyl ketone, and petroleum solvents. These solvents can be used alone or as a mixture.

As described above, the yellow resist composition for color filter of the present invention contains the pigment dispersion of the present invention as a colorant and can thus achieve the favorable hue of formed pixels and improved transparency and light permeability.

EXAMPLES

Hereinafter, the present invention will be described in more detail with reference to Examples and Comparative Examples. However, the present invention is not limited to these Examples. In the description below, "part" means "part by mass".

Production of compound represented by formula (1)
Compounds represented by the formula (1) of the present invention were produced by methods described below.

Production Example 1

Production of Compound (5)

In a nitrogen atmosphere, 29 parts of thionyl chloride were added dropwise to 10 parts of o-nitrobenzoic acid in 100 parts of chloroform and further reacted at 60° C. for 1 hour. After the completion of reaction, the mixture was cooled to 10° C. or lower, and 9 parts of triethylamine and 15 parts of di(2-ethylhexyl)amine were added dropwise thereto in this order. The mixture was further stirred at 80° C. for 2 hours. After the completion of reaction, extraction with chloroform was performed. The extract was concentrated under reduced pressure to obtain 18 parts of an intermediate (5-1).

50 parts of ethanol and 18 parts of a 20% aqueous sodium sulfide solution were added to 10 parts of the intermediate (5-1) and reacted at 75° C. for 1 hour. After the completion of reaction, extraction with chloroform was performed, and the resulting solution was concentrated under reduced pressure to obtain 7.4 parts of an intermediate (5-2).

3.4 parts of concentrated hydrochloric acid and 59 parts of methanol were added to 5.9 parts of the intermediate (5-2), and the mixture was cooled to 10° C. or lower. To this solution, a solution of 1.4 parts of sodium nitrite in water (2.0 parts) was slowly added dropwise so as not to become 10° C. or higher, and the mixture was further reacted for 1 hour. Subsequently, 0.5 parts of sulfamic acid were added thereto, and the mixture was stirred for 20 minutes to obtain a diazonium salt solution.

Next, a solution of 2.7 parts of 3-cyano-4-methyl-6-oxo-2-pyridone in 25 parts of N,N-dimethylformamide and 20 parts of methanol was cooled to 10° C. or lower, and the diazonium salt solution was added dropwise thereto with the temperature kept at 10° C. or lower. The pH of the reaction solution was adjusted to 5 to 6 by the addition of a saturated aqueous solution of sodium carbonate, and the resulting solution was reacted at 10° C. or lower for 2 hours. After the completion of reaction, the solvent was distilled off under reduced pressure, and the residue was purified by column chromatography to obtain 5.2 parts of a compound (5).

The obtained compound (5) was tested for its purity using high-performance liquid chromatography (HPLC) (LC2010A, manufactured by Shimadzu Corp.). In addition, the compound (5) was structurally determined using a time-of-flight mass spectrometer (TOF-MS) (LC/MSD TOF, manufactured by Agilent Technologies, Inc.) and a nuclear magnetic resonance spectrometer (NMR) (ECA-400, manufactured by JEOL Ltd.).

Results of Analyzing Compound (5)
<HPLC Results>
(Eluent: $CH_3OH:H_2O$=90:10, flow rate: 1.0 ml/min, detection wavelength: 254 nm)
retention time: 9.6 minutes, purity: 99.5 area %
<ESI-TOF-MS Results>
m/z=522.3458 $(M+H)^-$
<$^1$H NMR (400 MHz, $CDCl_3$, room temperature) results (see FIG. 1)>
δ [ppm]=8.59 (1H, s), 7.87 (1H, d), 7.54-7.49 (1H, m), 7.30 (2H, m), 3.52 (2H, s), 3.25 (2H, d), 2.64 (3H, s), 1.86-1.82 (1H, m), 1.51-0.63 (30H, m)

Production Examples 2 to 18

Production of Compounds (1) to (4) and (6) to (18)

The compounds (1) to (4) and (6) to (18) were synthesized and identified in the same way as in Production Example 1.

Production Example 19

Production of Compound (19)

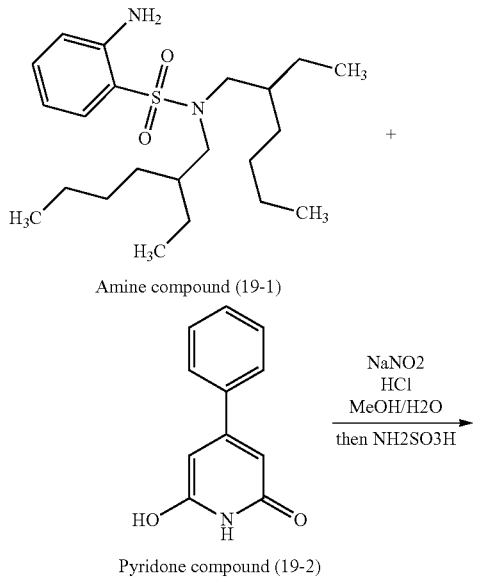

Amine compound (19-1)

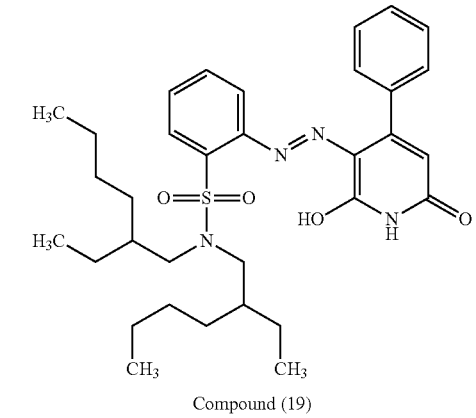

Compound (19)

A solution of an amine compound (19-1) (3.00 g) in methanol (10 ml) was cooled to 5° C., and 35% hydrochloric acid (1.3 mL) was added dropwise thereto. To this mixture, a solution of sodium nitrite (0.58 g) in water (3 mL) was added dropwise, and the mixture was stirred for 1 hour. Then, an excess of sodium nitrite was decomposed by the addition of amidosulfuric acid (0.09 g) to obtain a diazotized solution. Aside from this, a solution of a pyridone compound (19-2) (1.42 g) in methanol (10 mL) was cooled to 5° C. The diazotized solution was slowly added dropwise thereto with the temperature kept at 5° C. or lower. The mixture was further stirred at 0° C. to 5° C. for 1 hour. After the completion of reaction, the solution was neutralized into pH 6 by the dropwise addition of an aqueous sodium carbonate solution. Then, deposited solid was collected by filtration and further washed with water. The obtained solid was purified by column chromatography (developing solvent: chloroform/methanol) and further recrystallized over a heptane solution to obtain 3.0 g of a compound (19).

Results of Analyzing Compound (19)
<ESI-TOF-MS Results>
(1) $^1$H-NMR (400 MHz, CDCl$_3$, room temperature): δ [ppm]=0.76-0.85 (12H, m), 1.11-1.35 (16H, m), 1.55 (2H, br), 2.98-3.19 (4H, m), 6.31 (1H, s), 7.17 (1H, t, J=7.25 Hz), 7.42 (1H, t, J=7.25 Hz), 7.49 (6H, br), 7.79 (1H, d, J=7.63 Hz), 8.21 (1H, s), 14.81 (1H, s)
(2) Mass spectrometry by MALDI-TOF-MS: m/z=593.318 (M–H)$^-$ Production Example 20

Production of Compound (20)

A compound (20) was obtained by the same procedures as in Example 19 except that the amine compound and pyridone compound of Example 19 were changed to an amine compound (20-1) and a pyridone compound (20-2), respectively.

Results of Analyzing Compound (20)
<ESI-TOF-MS Results>
(1) $^1$H-NMR (400 MHz, CDCl$_3$, room temperature): δ [ppm]=1.08-1.41 (5H, m), 1.59-1.98 (14H, m), 2.31 (3H, s), 2.58 (1H, br), 3.28 (2H, br), 6.09 (1H, s), 7.16 (2H, m), 7.42 (1H, t, J=16.78 Hz), 7.80 (1H, d, J=8.39 Hz), 8.03 (1H, s), 14.31 (1H, s)
(2) Mass spectrometry by MALDI-TOF-MS: m/z=435.239 (M–H)$^-$ Production Example 21

Production of Compound (21)

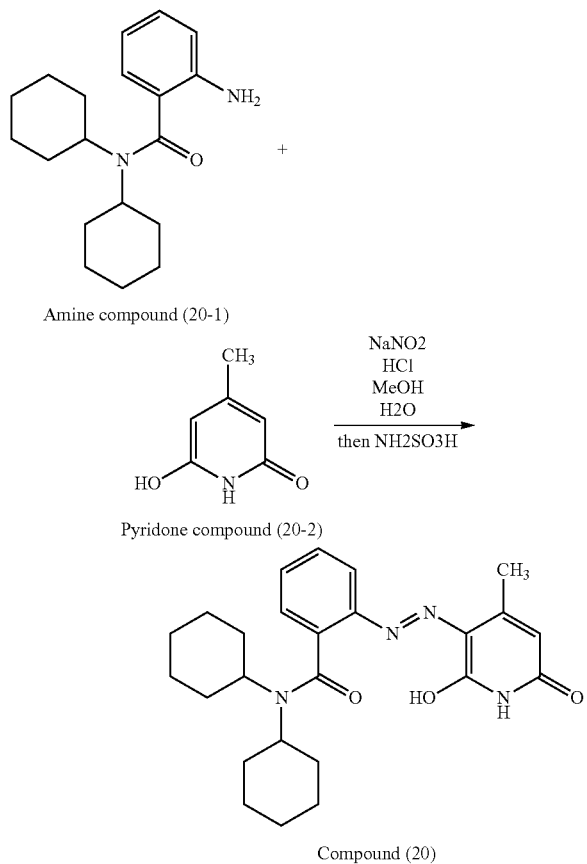

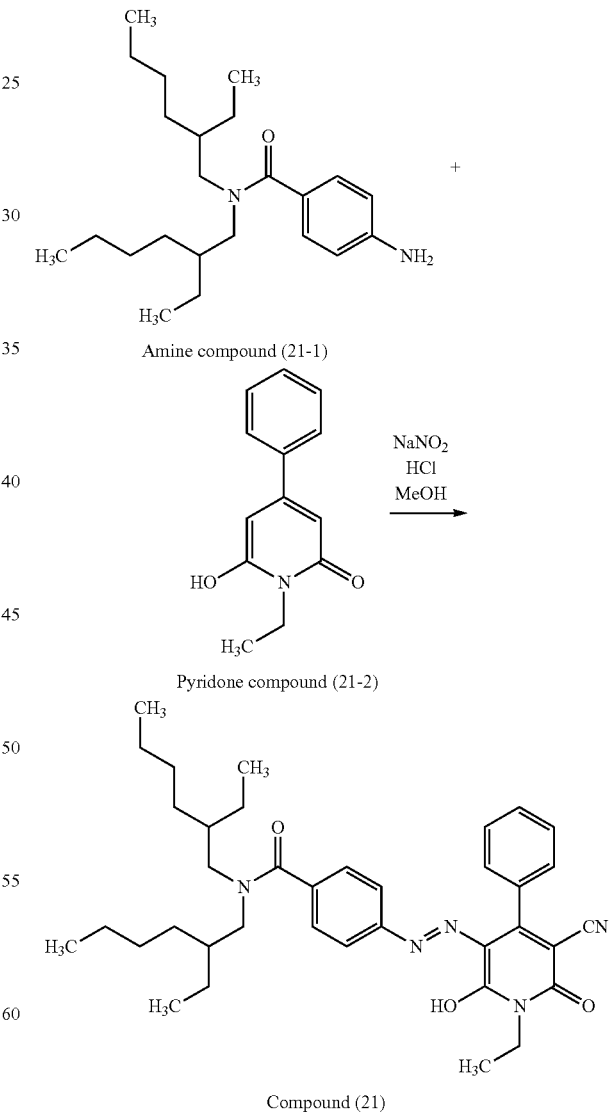

A solution of an amine compound (21-1) (1.8 g) in methanol (50 ml) was cooled to 5° C., and 35% hydrochloric acid (1.3 mL) was added dropwise thereto. To this mixture, a solution of sodium nitrite (0.4 g) in water (8 mL) was added dropwise, and the mixture was stirred for 1 hour to obtain a diazotized solution. Aside from this, a solution of a pyridone compound (21-2) (1.1 g) in methanol (30 mL) was cooled to 5° C. The diazotized solution was slowly added dropwise thereto with the temperature kept at 5° C. or lower. The mixture was further stirred at 0 to 5° C. for 1 hour. After the completion of reaction, the solution was neutralized into pH 6 by the dropwise addition of an aqueous sodium carbonate solution, followed by extraction with chloroform and concentration. The obtained powder was purified by column chromatography (developing solvent: chloroform) to obtain 2.6 g of a compound (21).

Results of Analyzing Compound (21)

<ESI-TOF-MS Results>

(1) $^1$H-NMR (400 MHz, CDCl$_3$, room temperature): δ [ppm]=0.65-0.73 (3H, m), 0.80-0.96 (11H, m), 1.01-1.05 (3H, m), 1.17-1.35 (15H, m), 1.63-1.74 (1H, br), 3.14 (2H, d, J=6.87 Hz), 3.40 (2H, d, J=7.63 Hz), 4.10-4.16 (2H, m), 7.18 (2H, d, J=8.39 Hz), 7.36 (2H, d, J=8.39 Hz), 7.48-7.58 (5H, m), 15.10 (1H, s)

(2) Mass spectrometry by MALDI-TOF-MS: m/z=610.818 (M–H)$^-$

Production Examples 22 to 26

Production of Compounds (22) to (26)>

The compounds (22) to (26) were synthesized and identified in the same way as in Production Example 20.

Production of pigment dispersion Pigment dispersions of the present invention and comparative pigment dispersions were produced by methods described below.

Example 1

Figure 2:
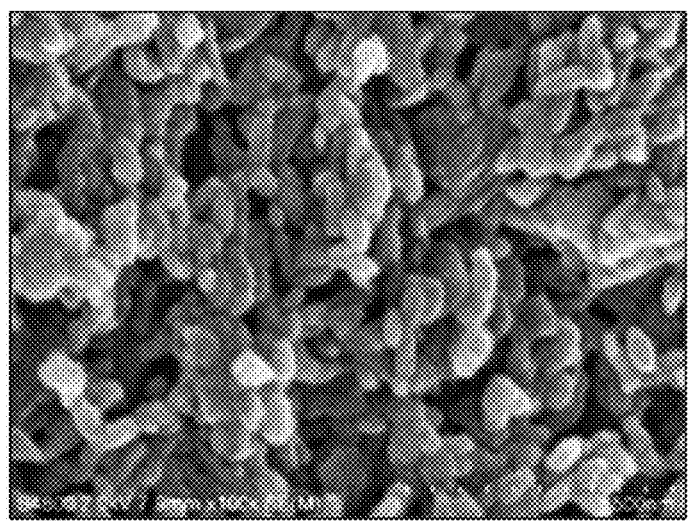
FIG. 2 is a diagram illustrating an SEM photograph of a pigment dispersion (1) containing a compound (1) represented by the formula (1) of the present invention.

A mixture of 5 parts of C.I. Pigment yellow 185 (manufactured by BASF Japan, Ltd., trade name "PALIOTOL Yellow D 1155") and 0.5 parts of the compound (1) was mixed with 48 parts of polyester resin and 120 parts of ethyl acetate and dispersed for 3 hours using an attritor (manufactured by Mitsui Mining Co., Ltd.) to obtain a pigment dispersion (1) of the present invention. The SEM photograph of the pigment dispersion (1) is illustrated in FIG. 2.

Example 2

A pigment dispersion (2) was obtained by the same procedure as in Example 1 except that the compound (1) of Example 1 was changed to 1.5 parts of the compound (2) and ethyl acetate was changed to toluene.

Example 3

A pigment dispersion (3) was obtained by the same procedure as in Example 1 except that the compound (1) of Example 1 was changed to 1.0 part of the compound (3) and ethyl acetate was changed to methyl ethyl ketone.

Example 4

A pigment dispersion (4) was obtained by the same procedure as in Example 1 except that the compound (1) of Example 1 was changed to 2.5 parts of the compound (4) and ethyl acetate was changed to styrene.

Example 5

A mixture of 7 parts of C.I. Pigment yellow 185 (manufactured by BASF Japan, Ltd., trade name "PALIOTOL Yellow D 1155") and 5.6 parts of the compound (5) was mixed with 48 parts of polyester resin and 120 parts of ethyl acetate and dispersed for 3 hours using an attritor (manufactured by Mitsui Mining Co., Ltd.) to obtain a pigment dispersion (5) of the present invention.

Example 6

A pigment dispersion (6) was obtained by the same procedure as in Example 5 except that the compound (5) of Example 5 was changed to 0.7 parts of the compound (6) and ethyl acetate was changed to toluene.

Example 7

A pigment dispersion (7) was obtained by the same procedure as in Example 5 except that the compound (5) of Example 5 was changed to 6 parts of the compound (7) and ethyl acetate was changed to methyl ethyl ketone.

Example 8

A mixture of 6 parts of C.I. Pigment yellow 185 (manufactured by BASF Japan, Ltd., trade name "PALIOTOL Yellow D 1155") and 1.2 parts of the compound (8) was mixed with 120 parts of styrene and dispersed for 3 hours using an attritor (manufactured by Mitsui Mining Co., Ltd.) to obtain a pigment dispersion (8) of the present invention.

Example 9

A pigment dispersion (9) was obtained by the same procedure as in Example 8 except that the compound (8) of Example 8 was changed to 1.8 parts of the compound (9) and styrene was changed to ethyl acetate.

Example 10

A pigment dispersion (10) was obtained by the same procedure as in Example 8 except that the compound (8) of Example 8 was changed to 4.8 parts of the compound (10) and styrene was changed to toluene.

Example 11

A mixture of 10 parts of C.I. Pigment yellow 185 (manufactured by BASF Japan, Ltd., trade name "PALIOTOL Yellow D 1155") and 1 part of the compound (11) was mixed with 40 parts of polyester resin and 120 parts of methyl ethyl ketone and dispersed for 3 hours using an attritor (manufactured by Mitsui Mining Co., Ltd.) to obtain a pigment dispersion (11) of the present invention.

Example 12

A pigment dispersion (12) was obtained by the same procedure as in Example 11 except that the compound (11) of Example 11 was changed to 2 parts of the compound (12) and methyl ethyl ketone was changed to styrene.

Example 13

A pigment dispersion (13) was obtained by the same procedure as in Example 11 except that the compound (11)

of Example 11 was changed to 5 parts of the compound (13) and methyl ethyl ketone was changed to styrene.

Example 14

A pigment dispersion (14) was obtained by the same procedure as in Example 11 except that the compound (11) of Example 11 was changed to 3 parts of the compound (14).

Example 15

A pigment dispersion (15) was obtained by the same procedure as in Example 11 except that the compound (11) of Example 11 was changed to 1 part of the compound (15) and methyl ethyl ketone was changed to styrene.

Example 16

A pigment dispersion (16) was obtained by the same procedure as in Example 1 except that the compound (1) of Example 1 was changed to 1.0 part of the compound (16).

Example 17

A pigment dispersion (17) was obtained by the same procedure as in Example 1 except that the compound (1) of Example 1 was changed to 2.5 parts of the compound (17) and ethyl acetate was changed to styrene.

Example 18

A pigment dispersion (18) was obtained by the same procedure as in Example 1 except that the compound (1) of Example 1 was changed to 1.5 parts of the compound (18) and ethyl acetate was changed to toluene.

Example 19

A pigment dispersion (19) was obtained by the same procedure as in Example 1 except that 0.5 parts of the compound (1) of Example 1 was changed to 10 parts thereof.

Example 28

A mixture of 5 parts of C.I. Pigment yellow 185 (manufactured by BASF Japan, Ltd., trade name "PALIOTOL Yellow D 1155") and 4.0 parts of the compound (20) was mixed with 48 parts of polyester resin and 120 parts of ethyl acetate and dispersed for 3 hours using an attritor (manufactured by Mitsui Mining Co., Ltd.) to obtain a pigment dispersion (28) of the present invention.

Example 29

A pigment dispersion (29) was obtained by the same procedure as in Example 28 except that the compound (20) of Example 28 was changed to 5.0 parts of the compound (21).

Example 30

A mixture of 10 parts of C.I. Pigment yellow 185 (manufactured by BASF Japan, Ltd., trade name "PALIOTOL Yellow D 1155") and 4.0 parts of the compound (22) was mixed with 40 parts of polyester resin and 120 parts of toluene and dispersed for 3 hours using an attritor (manufactured by Mitsui Mining Co., Ltd.) to obtain a pigment dispersion (30) of the present invention.

Example 31

A pigment dispersion (31) was obtained by the same procedure as in Example 30 except that the compound (22) of Example 30 was changed to 3.0 parts of the compound (23).

Example 32

A mixture of 7 parts of C.I. Pigment yellow 185 (manufactured by BASF Japan, Ltd., trade name "PALIOTOL Yellow D 1155") and 2.0 parts of the compound (24) was mixed with 40 parts of polyester resin and 120 parts of styrene and dispersed for 3 hours using an attritor (manufactured by Mitsui Mining Co., Ltd.) to obtain a pigment dispersion (32) of the present invention.

Example 33

A pigment dispersion (33) was obtained by the same procedure as in Example 30 except that the compound (22) of Example 31 was changed to 3.0 parts of the compound (25).

Example 34

A mixture of 8 parts of C.I. Pigment yellow 185 (manufactured by BASF Japan, Ltd., trade name "PALIOTOL Yellow D 1155") and 3.0 parts of the compound (26) was mixed with 40 parts of polyester resin and 120 parts of styrene and dispersed for 3 hours using an attritor (manufactured by Mitsui Mining Co., Ltd.) to obtain a pigment dispersion (33) of the present invention.

Example 35

A pigment dispersion (35) was obtained by the same procedure as in Example 34 except that the compound (26) of Example 34 was changed to 5.0 parts of the compound (27) and styrene was changed to toluene.

Comparative Example 1

A comparative pigment dispersion (comparison 1) was obtained by the same procedure as in Example 1 except that the compound (1) of Example 1 was not added.

Comparative Example 2

A pigment dispersion (comparison 2) was obtained by the same procedure as in Example 1 except that the compound (1) of Example 1 was changed to 1 part of a comparative compound (1) and ethyl acetate was changed to toluene.

Comparative Example 3

A pigment dispersion (comparison 3) was obtained by the same procedure as in Example 1 except that the compound (1) of Example 1 was changed to 0.5 parts of a comparative compound (2) and ethyl acetate was changed to methyl ethyl ketone.

Comparative Example 4

A pigment dispersion (comparison 4) was obtained by the same procedure as in Example 1 except that the compound (1) of Example 1 was changed to 2.5 parts of a comparative compound (3) and ethyl acetate was changed to toluene.

The comparative compounds are shown below.

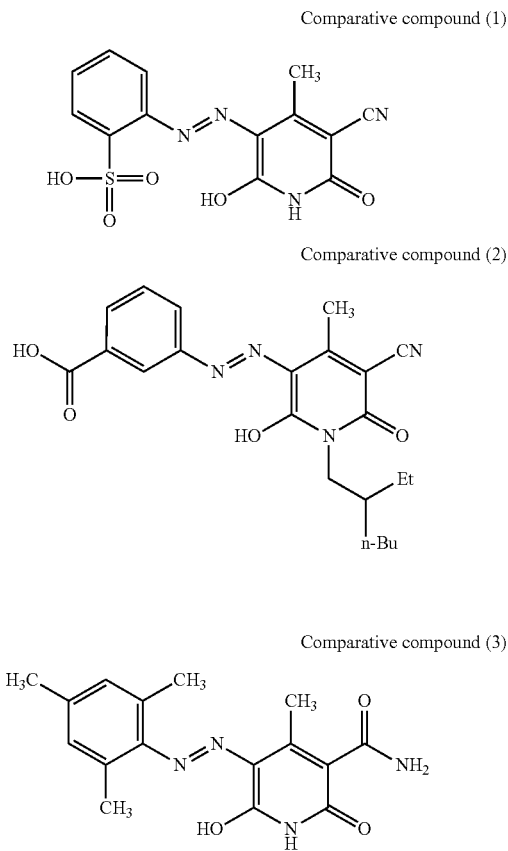

Comparative compound (1)

Comparative compound (2)

Comparative compound (3)

<Evaluation>

Dispersibility

The dispersibility of each pigment dispersion was evaluated as follows: the particle size of the pigment was measured using a grind meter (Tester Sangyo Co., Ltd.) to determine the dispersibility.

A: smaller than 2.5 μm (excellent dispersibility)

B: 2.5 μm or larger and smaller than 4.5 μm (good dispersibility)

C: 4.5 μm or larger (poor dispersibility)

Light Resistance

The light resistance of each pigment dispersion was evaluated as follows: the pigment dispersion was applied at a film thickness of 4.5 to 5.5 μm onto a film using a bar coater and dried overnight. Its color was measured using a colorimeter and used as an initial value. The light resistance was determined from the level of color change 100 hours later.

Xenon test apparatus (Atlas Weather-Ometer Ci4000; manufactured by Toyo Seiki Seisaku-Sho, Ltd.), temperature: 40° C., humidity: 60%, irradiation intensity: 0.39 W/m$^2$ A: the level of change from the initial value was less than 5 (excellent light resistance)

B: the level of change from the initial value was 5 or more and less than 15 (good light resistance)

C: the level of change from the initial value was 15 or more (poor light resistance)

Comprehensive Evaluation

Each pigment dispersion was comprehensively evaluated as follows: a pigment dispersion rated A in the comprehensive evaluation was confirmed to be practically available.

A: both dispersibility and light resistance were evaluated as A.

B: at least one of dispersibility and light resistance was evaluated as A.

C: both dispersibility and light resistance were evaluated as B or C.

The results of evaluating the pigment dispersions of Examples and the pigment dispersions of Comparative Examples are summarized in Table 1 wherein the term "PY185" used in the column "Pigment" represents C.I. Pigment yellow 185.

TABLE 1

| No | Pigment dispersion | Pigment | Amount of pigment | Resin | Dye | Amount of dye | Ratio of dye % | Solvent | Particle size | Dispersibility evaluation | Light resistance evaluation | Comprehensive evaluation |
|---|---|---|---|---|---|---|---|---|---|---|---|---|
| Example 1 | (1) | PY185 | 5 | Present | Compound (1) | 0.5 | 10 | Ethyl acetate | 2.3 | A | A | A |
| Example 2 | (2) | PY185 | 5 | Present | Compound (2) | 1.5 | 30 | Toluene | 2.0 | A | A | A |
| Example 3 | (3) | PY185 | 5 | Present | Compound (3) | 1.0 | 20 | Methyl ethyl ketone | 1.8 | A | A | A |
| Example 4 | (4) | PY185 | 5 | Present | Compound (4) | 2.5 | 50 | Styrene | 2.1 | A | A | A |
| Example 5 | (5) | PY185 | 7 | Present | Compound (5) | 5.6 | 80 | Ethyl acetate | 2.3 | A | A | A |
| Example 6 | (6) | PY185 | 7 | Present | Compound (6) | 0.7 | 10 | Toluene | 2.0 | A | A | A |
| Example 7 | (7) | PY185 | 6 | Present | Compound (7) | 6.0 | 100 | Methyl ethyl ketone | 2.2 | A | A | A |
| Example 8 | (8) | PY185 | 6 | Absent | Compound (8) | 1.2 | 20 | Styrene | 2.2 | A | A | A |
| Example 9 | (9) | PY185 | 6 | Absent | Compound (9) | 1.8 | 30 | Ethyl acetate | 2.4 | A | A | A |
| Example 10 | (10) | PY185 | 6 | Absent | Compound (10) | 4.8 | 80 | Toluene | 1.9 | A | A | A |
| Example 11 | (11) | PY185 | 10 | Present | Compound (11) | 1.0 | 10 | Methyl ethyl ketone | 2.1 | A | A | A |
| Example 12 | (12) | PY185 | 10 | Present | Compound (12) | 2.0 | 20 | Styrene | 2.2 | A | A | A |
| Example 13 | (13) | PY185 | 10 | Present | Compound (13) | 5.0 | 50 | Toluene | 2.0 | A | A | A |
| Example 14 | (14) | PY185 | 10 | Present | Compound (14) | 3.0 | 30 | Methyl ethyl ketone | 2.1 | A | A | A |

TABLE 1-continued

| No | Pigment dispersion | Pigment | Amount of pigment | Resin | Dye | Amount of dye | Ratio of dye % | Solvent | Particle size | Dispersibility evaluation | Light resistance evaluation | Comprehensive evaluation |
|---|---|---|---|---|---|---|---|---|---|---|---|---|
| Example 15 | (15) | PY185 | 10 | Present | Compound (15) | 1.0 | 10 | Styrene | 2.3 | A | A | A |
| Example 16 | (16) | PY185 | 5 | Present | Compound (16) | 1.0 | 20 | Ethyl acetate | 2.4 | A | A | A |
| Example 17 | (17) | PY185 | 5 | Present | Compound (17) | 2.5 | 50 | Styrene | 2.2 | A | A | A |
| Example 18 | (18) | PY185 | 5 | Present | Compound (18) | 1.5 | 30 | Toluene | 2.2 | A | A | A |
| Example 19 | (19) | PY185 | 5 | Present | Compound (1) | 10 | 200 | Ethyl acetate | 2.3 | A | C | C |
| Example 28 | (28) | PY185 | 5 | Present | Compound (20) | 4.0 | 80 | Ethyl acetate | 2.1 | A | A | A |
| Example 29 | (29) | PY185 | 5 | Present | Compound (21) | 5.0 | 100 | Ethyl acetate | 2.2 | A | A | A |
| Example 30 | (30) | PY185 | 10 | Present | Compound (22) | 4.0 | 40 | Toluene | 2.4 | A | A | A |
| Example 31 | (31) | PY185 | 10 | Present | Compound (23) | 3.0 | 30 | Toluene | 2.2 | A | A | A |
| Example 32 | (32) | PY185 | 7 | Present | Compound (24) | 2.0 | 29 | Styrene | 2.3 | A | A | A |
| Example 33 | (33) | PY185 | 7 | Present | Compound (25) | 3.0 | 43 | Styrene | 2.1 | A | A | A |
| Example 34 | (34) | PY185 | 8 | Present | Compound (26) | 3.0 | 38 | Styrene | 2.1 | A | A | A |
| Example 35 | (35) | PY185 | 8 | Present | Compound (27) | 5.0 | 63 | Toluene | 2.3 | A | A | A |
| Comparative Example 1 | (Comparison 1) | PY185 | 5 | Present | Absent | 0 | 0 | Ethyl acetate | 4.5 | C | A | C |
| Comparative Example 2 | (Comparison 2) | PY185 | 5 | Present | Comparative compound (1) | 1 | 20 | Styrene | 5.1 | C | B | C |
| Comparative Example 3 | (Comparison 3) | PY185 | 5 | Present | Comparative compound (2) | 0.5 | 10 | Methyl ethyl ketone | 3.9 | B | C | C |
| Comparative Example 4 | (Comparison 4) | PY185 | 5 | Absent | Comparative compound (3) | 2.5 | 50 | Toluene | 4.8 | C | C | C |

As is evident from Table 1, the pigment dispersions of C.I. Pigment yellow 185 obtained by the present invention are superior in both dispersibility and light resistance to the corresponding comparative pigment dispersions of C.I. Pigment yellow 185.

Example 20

<Preparation of Ink>
Production Example of Ink (1)
A mixture of 5 parts of C.I. Pigment yellow 185 (manufactured by BASF Japan, Ltd., trade name "PALIOTOL Yellow D 1155") and 1.0 part of the compound (1) was mixed with 120 parts of styrene and dispersed for 1 hour using an attritor (manufactured by Mitsui Mining Co., Ltd.) to obtain an ink of the present invention.

Examples 21 to 23

Each ink was obtained by the same procedures as in the above ink production example except that the compound (1) of Example 20 was changed to the compounds (3), (5), and (10).

Examples 36 to 38

Each ink was obtained by the same procedures as in the above ink production example except that the compound (1) of Example 20 was changed to the compounds (19), (21), and (24).

Comparative Example 5

5 parts of C.I. Pigment yellow 185 (manufactured by BASF Japan, Ltd., trade name "PALIOTOL Yellow D 1155") were mixed with 120 parts of styrene and dispersed for 1 hour using an attritor (manufactured by Mitsui Mining Co., Ltd.), and comparative ink was obtained.

Comparative Examples 6 and 7

Each comparative ink was obtained by the same procedures as in the above ink production example except that the compound (1) of Example 20 was changed to the comparative compounds (comparison 1) and (comparison 3).
Evaluation
The inks prepared in Examples 20 to 23 and 36 to 38 were excellent in the dispersibility of C.I. Pigment yellow 185 and had favorable tone and transparency. By contrast, the inks prepared in Comparative Examples 5, 6, and 7 had the poor dispersibility of C.I. Pigment yellow 185, non-uniform tone, and poor transparency.

Example 24

<Preparation of Yellow Resist Composition>
22 parts of the pigment dispersion (3) obtained in Example 3 were slowly added to a solution containing 6.7 parts of an acrylic copolymer composition, 1.3 parts of dipentaerythritol penta(meth)acrylate, and 0.4 parts of 2-benzyl-2-dimethylamino-1-(4-morpholinophenyl)-butanone-1 (photopolymerization initiator) in 96 parts of cyclohexanone, and the mixture was stirred at room temperature for 3 hours. This mixture was filtered through a 1.5-μm filter to obtain a yellow resist composition.
The surface of a glass substrate was spin-coated with the yellow resist composition thus obtained. Then, this coating was dried at 90° C. for 3 minutes, and the whole surface thereof was exposed to light. The coating was postcured at 180° C. to prepare a coating sample. The obtained coating sample had favorable light permeability and tone.
A mixture of 5 parts of C.I. Pigment yellow 185 (manufactured by BASF Japan, Ltd., trade name "PALIOTOL Yellow D 1155") and 3.0 parts of the compound (2) was mixed with 120 parts of cyclohexanone and dispersed for 1 hour using an attritor (manufactured by Mitsui Mining Co., Ltd.) to obtain an ink (5) of the present invention.

22 parts of the ink (5) were slowly added to a solution containing 6.7 parts of an acrylic copolymer composition (weight-average molecular weight: 10,000; this acrylic copolymer composition contained n-butyl methacrylate, acrylic acid, and hydroxyethyl methacrylate at a mass monomer ratio of 40% by mass, 30% by mass, and 30% by mass, respectively), 1.3 parts of dipentaerythritol pentaacrylate, and 0.4 parts of 2-benzyl-2-dimethylamino-1-(4-morpholinophenyl)-butanone (photopolymerization initiator) in 96 parts of cyclohexanone, and the mixture was stirred at room temperature for 3 hours. This mixture was filtered through a 1.5-μm filter to obtain a yellow resist composition (1) for color filter of the present invention.

The surface of a glass substrate was spin-coated with the yellow resist composition (1) for color filter. Then, this coating was dried at 90° C. for 3 minutes, and the whole surface thereof was then exposed to light. The coating was postcured at 180° C. to prepare a color filter.

Examples 25 to 27

Each color filter was obtained by the same procedures as in the above color filter production example except that the compound (2) of Example 24 was changed to the compounds (4), (12), and (15).

Examples 39 to 41

Each color filter was obtained by the same procedures as in the above color filter production example except that the compound (2) of Example 24 was changed to the compounds (20), (22), and (26).

Comparative Examples 8 and 9

Each color filter was obtained by the same procedures as in the above color filter production example except that the compound (2) of Example 24 was changed to the comparative compounds (comparison 2) and (comparison 4).

Evaluation

The coating samples obtained in Examples 25 to 27 and 39 to 41 had favorable tone and light permeability. By contrast, the inks prepared in Comparative Examples 8 and 9 clogged the filter during the filtration operation using the 1.5 μm-filter, due to their poor dispersibility of C.I. Pigment yellow 185, and thus failed to yield resist compositions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-043301, filed Feb. 29, 2012, which is hereby incorporated by reference herein in its entirety.

The invention claimed is:

1. A pigment dispersion comprising a dispersing medium, C.I. Pigment yellow 185, and a compound represented by formula (1), the C.I. Pigment yellow 185 and the compound being dispersed in the dispersing medium:

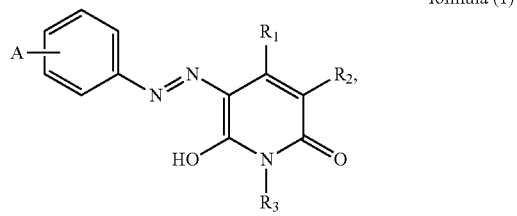

formula (1)

wherein:
A represents —CON($R_4$)$R_5$, wherein $R_4$ represents a hydrogen atom or an alkyl group, and $R_5$ represents an alkyl group;
$R_1$ represents an alkyl group, an aryl group, or an amino group;
$R_3$ represents an alkyl group; and
$R_2$ represents a hydrogen atom, a cyano group, a carboxylic acid group, a carboxylic acid ester group, a carboxylic acid amide group, or a carbamoyl group, and
wherein the dispersing medium is water, an organic solvent, or a mixture thereof.

2. The pigment dispersion according to claim 1, wherein a content of the compound represented by the formula (1) is 10 to 100 parts by mass with respect to 100 parts by mass of the C.I. Pigment yellow 185.

3. An ink composition comprising the pigment dispersion according to claim 1.

4. A yellow resist composition for a color filter comprising the pigment dispersion according to claim 1.

* * * * *